United States Patent

[11] 3,597,640

[72] Inventor James J. Kubinec
San Jose, Calif.
[21] Appl. No. 815,120
[22] Filed Apr. 10, 1969
[45] Patented Aug. 3, 1971
[73] Assignee National Semiconductor Corporation
Santa Clara, Calif.

[54] SHORT CIRCUIT PROTECTION MEANS FOR SEMICONDUCTIVE CIRCUIT APPARATUS
7 Claims, 6 Drawing Figs.

[52] U.S. Cl. ........ 307/303, 307/202, 307/297, 317/235 X, 317/33
[51] Int. Cl. ........ H01l 19/00
[50] Field of Search ........ 307/202, 297, 299, 303; 317/235, 33

[56] References Cited

UNITED STATES PATENTS

| | | | |
|---|---|---|---|
| 3,243,669 | 3/1966 | Sah | 317/235 |
| 3,343,037 | 9/1967 | Kutz | 317/235 |
| 3,471,755 | 10/1969 | Bilotti | 317/235 |
| 3,426,265 | 2/1969 | Till | 317/33 |

*Primary Examiner*—Jerry D. Craig
*Attorney*—Lowhurst & Hamrick

ABSTRACT: A novel emitter debiasing integrated circuit transistor configuration for providing improved short circuit protection in the output stages of logic apparatus and the like. The spreading resistance of a semiconductor device is incorporated into the output current path of the output stage and the emitter and collector of the device are appropriately connected to shunt the load current through an alternative resistive path in the circuit should the current flow through the spreading resistance exceed a predetermined value which is determined by the emitter debiasing potential of the semiconductor device.

INVENTOR
JAMES J. KUBINEC
BY
ATTORNEY

SHORT CIRCUIT PROTECTION MEANS FOR SEMICONDUCTIVE CIRCUIT APPARATUS

BACKGROUND OF THE INVENTION

The present invention relates generally to semiconductor circuit apparatus and, more particularly, to a novel semiconductor configuration for providing short circuit protection in integrated circuits and the like.

Since the output stages of most logic circuits are typically quite expensive, it has become standard practice to provide some form of short circuit protection so that the circuit cannot be accidentally caused to operate in a destructive mode. Heretofore, short circuit protection in the output stages of transistorized circuits has generally been provided by simply inserting a resistor in series with the output current path in order to prevent destruction of the circuit elements due to an accidental short-to-ground. A short-to-ground condition is very likely to occur at the output terminals of most circuits because of their exposure to screwdrivers and other external equipment. It is, of course, also possible that a fault condition might occur in the output load itself.

A simplified integrated logic output circuit typical of those utilized in the prior art is illustrated in FIG. 1 of the drawing. In this type of circuit a series resistor provides the desired output circuit overcurrent protection. Should the output terminals be accidentally subjected to a short or fault condition while switching stages between the output terminals and the voltage supply are in a conductive state, the current would be limited by the protective resistance and the circuit would not be destroyed.

The use of this protective resistance, however, is subject to several disadvantages. Firstly, the resistance must have a low impedance value in order for the output stage to be capable of conducting heavy output currents within the design range of the output stage during normal operating conditions. The resistance values used are typically 100 ohms or more. However, it is not a simple matter to make a 100 -ohm resistor in an integrated circuit because of the size requirements. The problem is that in order to produce a low value resistance, the resistive structure per se must be quite wide in order to handle the current load and thus takes up a considerable portion of the available chip area.

Secondly, the use of a resistor in the output current path generally means that the collectors of one or more of the switching elements are no longer at the most positive supply voltage since they are separated therefrom by the resistor. As a result they must be separately isolated from all of the other components on the chip. If the need for the resistor could be eliminated, no such isolation would be required since any transistor which has its collector tied to the most common positive supply does not have to be isolated because the most positive supply in an integrated circuit is normally tied to the substrate material of the chip anyway for biasing purposes. Thus, by eliminating the need for the large protection resistance utilized in the prior art, the required chip size can be reduced substantially.

OBJECTS OF THE INVENTION

It is therefore a principal object of the present invention to provide a novel integrated circuit element for providing short circuit protection without requiring that a large chip area be allocated thereto.

Another object of the present invention is to provide a novel semiconductive circuit element which can be utilized in an integrated output circuit for providing short circuit protection without introducing into the output current path the large impedance which is typical in the prior art apparatus.

Still another object of the present invention is to provide a novel output circuit for integrated logic circuitry, or the like, including a novel short circuit protection element as an operative component thereof.

SUMMARY OF THE PRESENT INVENTION

In accordance with the present invention, a novel short circuit protection device is provided for use in the output stages of TTL DTL logic circuits and the like, sometimes known as Totem Pole, Active Pull-up, or Cascaded Output Circuits. The device includes a novel transistor configuration wherein the emitter interconnect is connected to one portion of an elongated emitter region, and the base interconnect is extended to contact another portion of the emitter region so as to effectively couple the spreading resistance of the emitter region in shunt across the base-emitter junction of the transistor element. The low resistance emitter spreading resistance and the base-emitter junction of this device may therefore be incorporated into an appropriate output circuit to provide short circuit protection through the emitter debiasing action of the device.

A principal advantage of this method of providing short circuit protection is that the novel device can be utilized in the output current path of an appropriate output circuit to provide short circuit protection without requiring isolation of other active elements in the circuit.

Still another advantage of the present invention is that the effective resistance introduced into the output current path by the novel short circuit protection device is substantially less than has heretofore been feasible in integrated circuitry.

Still another advantage of the present invention is that because of the reduced impedance to current flow in the output current path, a much larger voltage is available at the output terminals for a given output current value.

Still another advantage of the present invention is that the operating characteristics of the novel short circuit protection element can be accurately controlled and a more predictable short circuit current limit level can be achieved.

Still another advantage of the present invention is that the overall chip area required for a given output stage can be substantially reduced by utilizing the normal semiconductor device as a short circuit protection component.

Many other advantages of the present invention will become apparent to those of skill in the art. I have chosen to describe my invention by referring to the following preferred exemplary embodiment which is illustrated in the several figures of the drawings.

IN THE DRAWING

FIG. 1 schematically illustrates a prior art output circuit using a resistive short circuit protection means.

DESCRIPTION OF THE PREFERRED EMBODIMENTS

Figure 1:
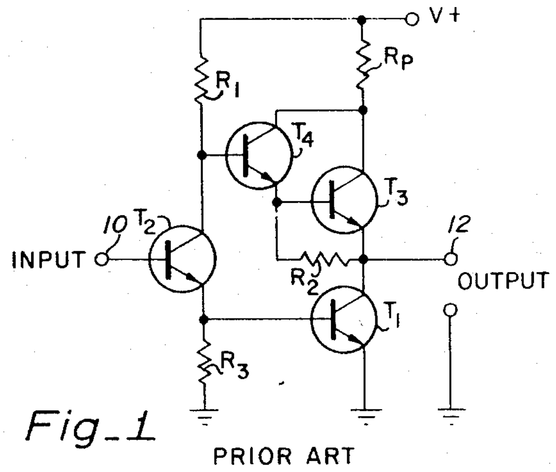
Fig 1 PRIOR ART

Referring now to FIG. 1 of the drawing, a circuit is shown schematically illustrating a typical output stage which might be utilized in integrated circuit logic apparatus and the like. The circuit includes an input terminal 10 and output terminals 12, four NPN transistors T1, T2, T3, T4, three biasing resistors R1, R2, and R3, and a short circuit protection resistor $R_p$. Since the resistance $R_p$ is in the output current path as shown, it must be of as low a value as possible in order to permit the output stage to conduct the required heavy output current under normal operating conditions, but still limit the current to a range which will not cause the active elements to be destroyed. A typical value for $R_p$ is 100 ohms or more.

The principal problem with this current limiting method is that it is not easy to make a 100 ohm resistor in an integrated circuit using current technology. In order to do so, the resistance must be made quite large in order to obtain the desired low value of resistance. This, of course, requires a large proportion of the surface area of a given semiconductor chip.

Another problem is that since the collectors of the transistors T3 and T4 are separated from the source V+ by resistor $R_p$ and are thus no longer at the most positive supply voltage, they must be separately isolated from the other components on the chip. This, of course, requires additional chip area.

Figure 2:
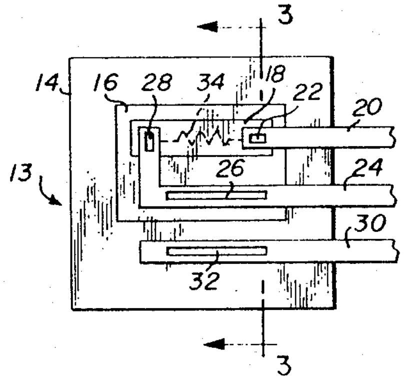
FIG. 2 is a top view of a short circuit protection device in accordance with the present invention.
Figure 3:
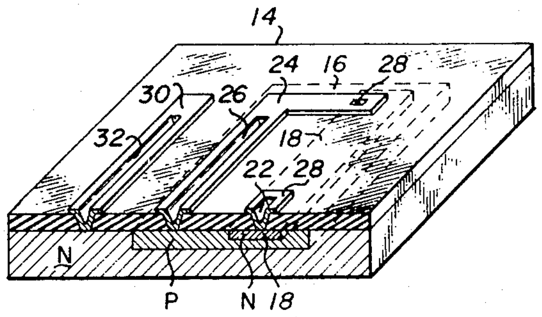
FIG. 3 is a sectioned perspective of the semiconductive chip illustrated in FIG. 2 cut along the line 3–3.

In accordance with the present invention, no such individual resistor is required. Instead, the short circuit protection is accomplished by utilizing a semiconductive element such as is illustrated in FIGS. 2 and 3 of the drawing. In the illustrated preferred embodiment, the bipolar device 13 is formed in an N-type substrate which provides collector region 14 having a P-type base region 16 diffused therein. An elongated N-type region is diffused into the N-type region 16 to form an emitter region 18.

In order to provide electrical access to the device the metallic interconnects 20, 24 and 30 are provided. The emitter interconnect ohmically contacts the emitter region 18 at 22. The base interconnect 24 ohmically contacts the base region 16 at 26 and is extended beyond the contact 26 where it ohmically contacts the other end 28 of the emitter region 18. The collector interconnect 30 is suitably connected to the collector region 14 at 32.

The effect of extending the base interconnect 24 to ohmically contact the emitter region 18 at 28 is to provide a shunt path around the base-emitter junction via the spreading resistance 34 of the emitter region 18. This is, perhaps, more dramatically illustrated in the schematic diagram of FIG. 4 wherein the spreading resistance 34 is shown connected between the base 28 and the emitter 22. Since the emitter in a bipolar transistor has a finite internal spreading resistance, current forced through the emitter region 18 from the contact 28 to the contact 22 will cause a potential drop to occur therebetween. The use of the spreading resistance to externally couple the emitter and base regions of a transistor effectively provides an integrated circuit approach to emitter debiasing.

Because the spreading resistance is primarily dependent upon the width of the emitter, the sheet resistance thereof, and the distance between the contacts 28 and 22, the spreading resistance 34 can be predictably controlled using contemporary manufacturing techniques. The characteristics of the emitter region 18 are preferably chosen so as to produce a resistance of approximately 10 ohms in the disclosed embodiment although any other suitable value can be chosen.

Conventional current forced into the emitter region 18 at point 28, and out at point 22 will cause the emitter interconnect 20 to be biased negatively with respect to the base interconnect 24. The value of this bias is I × R, where I is the current and R is the spreading resistance of the emitter 18. Should the magnitude of this bias reach the forward potential of the emitter-base diode, the end 22 of the emitter 18 will inject current. If the collector interconnect 30 is biased positively with respect to the base interconnect 24, alpha times this injected current will appear in the collector interconnect 30. In other words, the spreading resistance 34 is chosen such that current flowing through the resistance 34 from base interconnect 24 to emitter interconnect 20 will cause the transistor T to become conductive at a predetermined value of the current I.

Figure 5:
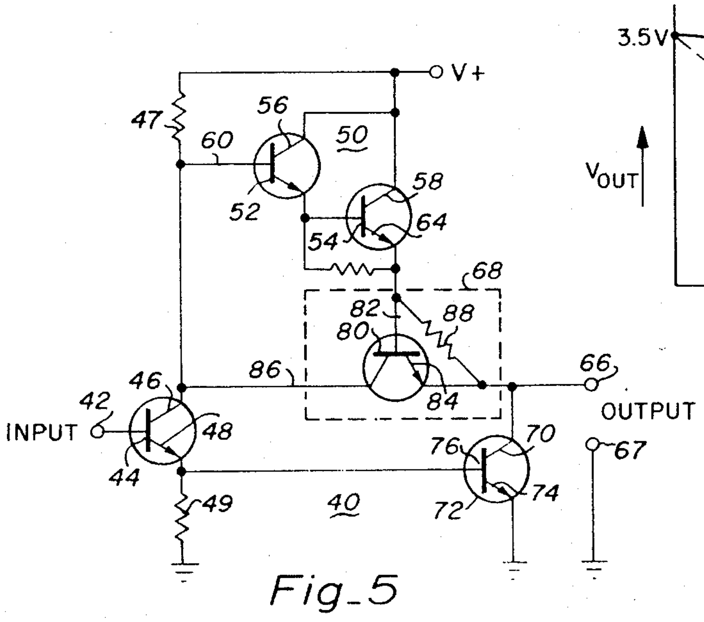
FIG. 5 is a schematic diagram of a digital logic output stage including a short circuit protection device in accordance with the present invention.

Turning now to FIG. 5, the utility of the novel emitter debiased transistor as a short circuit protection element will be described. In the circuit 40, which may for example, be a logic output stage, the input terminal 42 is connected to the base of an NPN transistor 44, which serves as a first switching means, has its collector 46 connected to a potential supply V+ through a resistor 42. The emitter 48 is connected to ground through a resistor 49.

The Darlington connected circuit 50 serves as a second switching means and includes a pair of NPN transistors 52 and 54 with the collectors 56 and 58 thereof connected to the source V+. The base 60 of transistor 52 is coupled to the low side of the resistor 47 at 62 and the emitter 64 of the transistor 54 is coupled to the output terminal 66 through the short circuit protection device 68. A load means, which is activated in response to an input signal applied to input terminal 42, is coupled across output terminals 66 and 67. The collector 70 of the transistor 72 is connected to the output terminal 66 and the emitter 74 thereof is grounded. The base 76 of transistor 72 is connected to the emitter 48 of input transistor 44.

Figure 4:
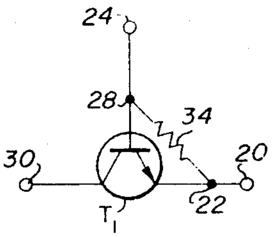
FIG. 4 is a schematic equivalent of the chip illustrated in FIGS. 2 and 3.

The short circuit protection device 68 is comprised of an integrated emitter debiased transistor circuit 80 of the type illustrated in FIGS. 2, 3, and 4. The base 82 is connected to the emitter 64 of transistor 54, and the emitter 84 is connected to the output terminal 66. The collector 86 is connected to the collector 46 of transistor 44. The spreading resistance of the device 68 is illustrated as a shunt resistance 88 across the emitter-base junction of the transistor 80.

In operation, a positive input signal applied to terminal 42 of the circuit 40 causes the transistor 44 to become conductive and complete a current path from the source V+ through the resistance 47, the transistor 44 and the resistance 49 to ground. The resultant voltage drop across the resistance 49 raises the base potential of the transistor 72 and causes it to turn on. The voltage drop across resistor 47 causes the base potential of transistor 52 to be reduced turning both of the transistors 52 and 54 off. With the transistor 72 and the semiconductors 50 off, the base 82 of transistor 80 is at substantially the same potential as the emitter 84 and is thus in a nonconductive state. Thus, with no current path being completed to the source V+the output available at terminal 66 is substantially zero volts. Should output terminal 66 now be shorted to ground, no damage could occur.

When the input signal applied to input terminal 42 is driven negative, the drive is removed from transistor 44 and it is caused to turn off. As it turns off the current flow through the resistor 49 is interrupted causing the voltage applied to the base 76 of transistor 72 to go to ground potential, turning transistor 72 off. The voltage at collector 46 of transistor 44, however, rises toward the supply voltage and turns on the Darlington circuit 50 causing the voltage at output terminal 66 to rise.

Although the potential at base 82 of transistor 80 rises it is not normally turned on since the potentials on the collector 86 and emitter 84 are likewise increased. Thus, any current drawn from the output terminals 66 must pass from the source V+ through the circuit 50, and the debiasing resistance 88 of the short circuit protection device 68. Since this resistance is low, e.g., 10 ohms in a preferred embodiment, the impedance to the output current flow is low, the output voltage available at output terminals 66 for a given output current is substantially larger than obtainable using prior art circuits.

As the output current drawn from terminal 66 varies, the voltage drop across resistance 88 causes the base-emitter junction of transistor 80 to be variably debiased and will cause the transistor to turn on if the current drawn from the output terminals 66 exceeds a predetermined value, i.e., the short circuit current. Should the output current exceed the short circuit current value and cause transistor 80 to be turned on, a current path will be provided from the source V+ through the resistance 47 to the output terminal 66.

The resultant voltage drop across the resistance 47 causes the drive applied to the circuit 50 to be reduced causing it to turn off thus interrupting the current flow through resistance 88. The resistance 47 now serves as the current limiting means for the output circuit during the overload condition. Should the short circuit current at the output 66 return to an acceptable level the drop across resistor 47 will be reduced and circuit 50 will again be turned on and transistor 80 will be turned off so that the output current is again flowing through the debiasing resistance 88.

If the load is a transient load, such as a capacitor, the effect of the device 58 is to limit the rate at which the capacitor may be charged, however, the load is allowed to go up to the full value of voltage which, in this circuit, is the positive supply voltage $V^+$ minus the drop across the debiasing resistor 88. If the load is a DC or fault load, such as a very low resistance or short-to-ground, the current will be limited to the chosen short circuit value and, of course, the output voltage will be clamped at ground or whatever the short is clamping it at.

Figure 6:
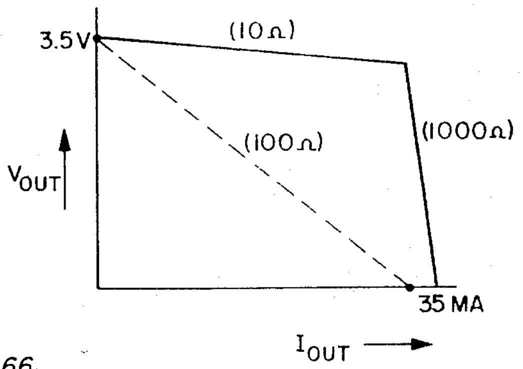
FIG. 6 is a diagram illustrating the advantages of the short circuit protection device of the present invention.

As a further illustration of the improvement provided by the novel short circuit protection device over the prior art structure illustrated in FIG. 1, reference is made to FIG. 6 of the drawing. With the voltage source $V^+$ at 3.5 volts, for example, the output voltage versus current available at the output terminals 12 of the prior art circuit using a 100-ohm resistance $R_p$ is illustrated by the dashed lines. Note that as the output current $I_{out}$ increases, the output voltage level $V_{out}$ decreases at a substantial rate.

Using the short circuit protection device of the present invention, the output voltage is limited only by the 10-ohm debiasing resistance 88 so that the slope of the available output voltage for increasing output current within the operational limits of the circuit is only one-tenth that of the best prior art circuits. When the output current reaches the unacceptable level, 36 milliamps for example, the drop across the debiasing resistance 88 causes the transistor 80 to be turned on to open the conductive path through resistance 47 as explained above. The effect then, is to cause a very sharp fall-off in output voltage because of the impedance characteristics introduced into the load circuit by the turning on of the transistor 80. In the illustrated example, the resistor 47 has a resistance of 1,000 ohms. By using the short circuit protection means of the present invention capacitive loads may be charged at much faster rates. This means that larger fan-outs of other logic gates can be tied to the output terminals 66 because larger output voltages can now be supplied for any given output current.

The advantages of the present invention over the prior art method of short circuit protection are therefore quite apparent, and the novel device will be recognized as having great utility in many types of circuits. Not only does the device produce much better output conditions than are available using the prior art methods, but it saves substantial chip area in the integrated circuit, thus enabling the overall size of the integrated circuit to be substantially reduced.

Whereas many other applications and modifications of the present invention will be apparent to those of skill in the art, it is to be understood that this description is of a preferred embodiment offered for illustrative purposes only, and the invention is in no manner intended to be limited to the particular embodiment disclosed. Accordingly, I intend that the appended claims be interpreted as covering all modifications which fall within the true spirit and scope of my invention.

What is claimed is:

1. In an output stage for a logic circuit means including a voltage supply terminal and first and second parallel circuits for alternatively providing current paths connecting said voltage supply terminal to a circuit ground, said first parallel circuit including a first resistor and a first switching means connected in series, said second parallel circuit including, a second switching means responsive to said first switching means, a short circuit protection means and a load means connected in series, an improved short circuit protection means comprising:

a three terminal semiconductor device including a collector, a base forming a first PN junction with said collector, and an elongated emitter forming a second PN junction with said base, a collector interconnect coupled to said first parallel circuit between said first resistor and said first switching means and ohmically contacting said collector, a base interconnect coupled to said second switching means and ohmically contacting said base and one extremity of said emitter, and an emitter interconnect coupled to said load means and ohmically contacting an opposite extremity of said emitter, the spreading resistance of said emitter between said one extremity and said opposite extremity providing a debiasing resistance shunting said second PN junction, whereby current flowing in said second parallel circuit and through said debiasing resistance causes said semiconductor device to be maintained normally nonconductive unless said current becomes large enough to bias said semiconductor device conductive, in which case a bypass current path is provided from said voltage supply terminal through said first resistor to said load means.

2. A logic circuit comprising:

a first terminal for connection to a source of potential;

a second terminal and a third terminal across which a load to be energized by said source of potential may be connected;

a short circuit protection means including, a first body of semiconductive material of a first conductivity type;

a second body of semiconductive material of a second conductivity type disposed contiguous with said first body and forming a first PN junction therebetween;

a third body of semiconductive material of said first conductivity type disposed contiguous with said second body and forming a second PN junction therebetween;

first metallic connector means ohmically contacting said first body;

second metallic connector means ohmically contacting said second body and further ohimcally contacting one extremity of said third body; and third metallic connector means coupled to said second terminal and ohmically contacting an opposite extremity of said third body, whereby the spreading resistance of said third body between said first extremity and said opposite extremity provides a debiasing resistive shunt across said second PN junction;

a resistor coupling said first connector means to said first terminal;

first switching means responsive to an input signal and operative to couple said first connector means to said third terminal; and second switching means responsive to said first switching means and operative to couple said second connector means to said first terminal.

3. A logic circuit as recited in claim 2 and further comprising third switching means responsive to said first switching means and operative to couple said second terminal to said third terminal when said first switch means is in a particular switching state.

4. A logic circuit as recited in claim 2 wherein said second switching means includes a Darlington connected transistor switching circuit.

5. A logic circuit as recited in claim 2 wherein said first switching means includes a first transistor having a first base for receiving said input signal, a first emitter coupled to said third terminal, and a first collector coupled to said first connector means and said resistor.

6. A logic circuit as recited in claim 5 and further comprising a third switching means including a second transistor having a second base coupled to said first emitter, a second emitter coupled to said third terminal and a second collector coupled to said second terminal.

7. A logic circuit as recited in claim 5 wherein said second switching means includes a Darlington connected transistor switching circuit having a fourth terminal coupled to said first terminal, a fifth terminal coupled to said first collector, and a sixth terminal coupled to said second connector means.